(12) United States Patent
Wang et al.

(10) Patent No.: US 11,297,129 B2
(45) Date of Patent: Apr. 5, 2022

(54) METHOD AND DEVICE FOR IDENTIFYING DISTRIBUTION NETWORK TOPOLOGY ERROR

(71) Applicants: ELECTRIC POWER SCIENCE & RESEARCH INSTITUTE OF STATE GRID TIANJIN ELECTRIC POWER COMPANY, Tianjin (CN); STATE GRID TIANJIN ELECTRIC POWER COMPANY, Tianjin (CN); STATE GRID CORPORATION OF CHINA, Beijing (CN)

(72) Inventors: Xudong Wang, Tianjin (CN); Yi Ding, Tianjin (CN); Shiqian Ma, Tianjin (CN); Yan Qi, Tianjin (CN); Jian Zhuang, Tianjin (CN); Guodong Li, Tianjin (CN); Tianchun Xiang, Tianjin (CN); Jikeng Lin, Shanghai (CN); Gaomeng Wang, Tianjin (CN)

(73) Assignees: ELECTRIC POWER SCIENCE & RESEARCH INSTITUTE OF STATE GRID TIANJIN ELECTRIC POWER COMPANY; STATE GRID TIANJIN ELECTRIC POWER COMPANY; STATE GRID CORPORATION OF CHINA

( * ) Notice: Subject to any disclaimer, the term of this patent is extended or adjusted under 35 U.S.C. 154(b) by 802 days.

(21) Appl. No.: 16/301,555

(22) PCT Filed: Sep. 21, 2018

(86) PCT No.: PCT/CN2018/107061
§ 371 (c)(1),
(2) Date: Nov. 14, 2018

(87) PCT Pub. No.: WO2019/128335
PCT Pub. Date: Jul. 4, 2019

(65) Prior Publication Data
US 2021/0234922 A1 Jul. 29, 2021

(30) Foreign Application Priority Data
Dec. 29, 2017 (CN) .......................... 201711476473.9

(51) Int. Cl.
*H04L 29/08* (2006.01)
*H04L 67/1008* (2022.01)
(Continued)

(52) U.S. Cl.
CPC ...... *H04L 67/1008* (2013.01); *G01R 19/2513* (2013.01); *H04L 41/12* (2013.01);
(Continued)

(58) Field of Classification Search
CPC ..... H04L 67/1008; H04L 41/12; H04L 45/02; H04L 67/101; H04L 67/1012;
(Continued)

(56) References Cited

U.S. PATENT DOCUMENTS

2013/0049764 A1* 2/2013 Koliwad .............. G01R 31/086
324/522
2014/0277796 A1* 9/2014 Peskin ...................... G05F 1/10
700/291
(Continued)

FOREIGN PATENT DOCUMENTS

CN 102005757 A 4/2011
CN 104679968 A 6/2015
(Continued)

OTHER PUBLICATIONS

"Fault Locating in Distribution Networks with the Aid of Advanced Metering Infrastructure"; Baldwin et al.; 2014 Clemson University Power Systems Conference; Mar. 11, 2014 (Year: 2014).*
(Continued)

*Primary Examiner* — Benjamin H Elliott, IV
(74) *Attorney, Agent, or Firm* — McDonald Hopkins LLC

(57) ABSTRACT

Provided are a method and a device for identifying a distribution network topology error. The method includes: calculating a voltage of a coupling node to which each load belongs and obtaining a voltage sample space of coupling nodes to which all loads belong; calculating a current of a branch to which each load belongs and obtaining a current
(Continued)

sample space of branches to which all loads belong; calculating a voltage correlation coefficient and a current correlation coefficient respectively between different loads according to the obtained voltage sample space and the current sample space; and completing verification and correction of the distribution network topology.

20 Claims, 4 Drawing Sheets

(51) Int. Cl.
    *G01R 19/25*     (2006.01)
    *H04L 45/02*     (2022.01)
    *H04L 67/101*     (2022.01)
    *H04L 67/1012*     (2022.01)
    *H04L 41/12*     (2022.01)

(52) U.S. Cl.
    CPC ............ *H04L 45/02* (2013.01); *H04L 67/101* (2013.01); *H04L 67/1012* (2013.01)

(58) Field of Classification Search
    CPC .............. H04L 67/12; H04L 2001/0092; H02J 2203/20; H02J 3/00; G01R 19/2513
    See application file for complete search history.

(56) References Cited

U.S. PATENT DOCUMENTS

| | | | | |
|---|---|---|---|---|
| 2015/0120222 A1* | 4/2015 | Roytelman | ......... | H02J 13/0006 702/60 |
| 2015/0241482 A1* | 8/2015 | Sonderegger | .......... | G06Q 50/06 702/65 |
| 2017/0108572 A1* | 4/2017 | Micek | ...................... | G01D 4/00 |
| 2017/0315570 A1* | 11/2017 | Peskin | ............. | H02J 13/00017 |
| 2018/0156851 A1* | 6/2018 | Driscoll | ................. | G01R 25/00 |
| 2018/0356449 A1* | 12/2018 | Leonard | ............. | G01R 19/2513 |
| 2020/0287388 A1* | 9/2020 | Alizadeh-Mousavi | | ...................... H02J 3/388 |
| 2021/0013717 A1* | 1/2021 | Eckhardt | ........... | H02J 13/00017 |
| 2021/0234922 A1* | 7/2021 | Wang | ................. | G01R 19/2513 |

FOREIGN PATENT DOCUMENTS

| | | | |
|---|---|---|---|
| CN | 105514994 | | 4/2016 |
| CN | 106300331 | | 1/2017 |
| CN | 106599318 | | 4/2017 |
| CN | 107370147 | | 11/2017 |
| CN | 107370147 A | * | 11/2017 |
| CN | 107453357 A | | 12/2017 |
| CN | 108173263 A | | 6/2018 |

OTHER PUBLICATIONS

Luan et al., "Distribution Network Topology Error Correction Using Smart Meter Data Analytics."Smart Metering Program. 978. 2013.
Luan et al., "Smart Meter Data Analytics for Distribution Network Connectivity Verification." IEEE Transactions on Smart Grid.
State Intellectual Property Office of People's Republic of China, Notification of First Office Action for Application No. 201711476473. 9, report dated May 19, 2021, China.
Chinese Search Report for Application No. 201711476473.9.
International Search Report dated Dec. 28, 2018; International Patent Application No. PCT/CN2018/107061.

* cited by examiner

# METHOD AND DEVICE FOR IDENTIFYING DISTRIBUTION NETWORK TOPOLOGY ERROR

CROSS-REFERENCES TO RELATED APPLICATIONS

This is a National Stage Application, filed under 35 U.S.C. 371, of International Patent Application No. PCT/CN2018/107061, filed on Sep. 21, 2018, which claims priority to Chinese patent application No. 201711476473.9 filed on Dec. 29, 2017, contents of both of which are incorporated herein by reference in their entireties.

TECHNICAL FIELD

The present disclosure relates to the technical field of power system parameter identification and, in particular, to a method and a device for identifying a distribution network topology error.

BACKGROUND

The power system topology analysis data is mainly composed of switching values. However, in the process of collecting switching values, bad data inevitably occurs due to system equipment, network and other reasons, causing errors occurring in the network topology information. However, the correct network topology is the basis of power flow calculation, state estimation, fault location, isolation and power restoration, network reconfiguration, reliability analysis and other analyses. With the continuous development of the construction of smart grid, distribution automation systems of different levels have been gradually put into use, and the topology error identification function is one of the important foundations to ensure the effective operation of many functions of the systems.

Scholars at home and abroad have carried out a lot of researches on power grid topology error identification, and proposed various identification methods, including power flow transfer approach, innovation graph approach, residual method, set theory method, minimum information loss method and the like.

The transfer power flow approach is good at identifying single topology errors and multiple related telemetry errors. However, this approach must obtain a well-debugged section state as the base state in advance. If the selected base state is significantly different from the current topology, the topology error identification effect of the approach will be greatly reduced. The innovation graph approach has a good identification effect when dealing with multiple topology errors and multiple related telemetry errors, but this approach is suffer from the sudden load change, which has a great influence on the identification effect. The residual method, set theory method and minimum information loss method establish an estimation model in which the telesignalization is consistent with the telemetry, and then transform the problem of topology error identification into a problem of large-scale mixed integer programming problem. However, the identification effect of these methods is poorer than a single state estimation in the aspect of convergence and stability, and these methods are not suitable for on-line applications. These conventional methods rely on a single data source and have a complex calculation process.

With continuous progress of the construction of smart grid and the operation of a large number of smart sensors as well as the application of advanced meter infrastructure (AMI) in distribution networks, a large number of data sources and new technical means are provide for the power system topology error identification. However, since the research on the distribution network topology error identification based on AMI measurement data is still in its initial stage, the present application proposes a distribution network topology error identification algorithm based on measurement information provided by the AMI.

SUMMARY

The present disclosure provides a method for identifying a distribution network topology error, which has a reasonable design, a fast identification speed and a reliable identification effect.

The present application provides a method for identifying a distribution network topology error.

The method includes:

calculating a voltage $U_{pc}$ of a coupling node to which each load belongs in the distribution network topology and obtaining a voltage sample space of coupling nodes to which all loads belong in the distribution network;

calculating a current $I_L$ of a branch to which each load belongs in the distribution network topology and obtaining a current sample space of branches to which all loads belong in the distribution network;

calculating a voltage correlation coefficient and a current correlation coefficient respectively between different loads according to the obtained voltage sample space and the current sample space; and completing verification and correction of the distribution network topology according to the voltage correlation coefficient and the current correlation coefficient.

In an embodiment, the calculating a voltage $U_{pc}$ of a coupling node to which each load belongs in the distribution network topology and obtaining a voltage sample space of coupling nodes to which all loads belong in the distribution network includes:

calculating a voltage $U_{pc}$ of a coupling node of a feeder to which each load belongs according to measurement information of a coupling node voltage amplitude of each load collected by an advanced meter infrastructure (AMI) in an entire time series of collecting data based on the AMI to obtain the voltage sample space of the coupling nodes to which all loads belong in the distribution network.

In an embodiment, the calculating a voltage $U_{pc}$ of a coupling node of a feeder to which each load belongs to obtain the voltage sample space of the coupling nodes to which all loads belong in the distribution network includes: according to Ohm's law, the voltage amplitude at a coupling node PCj (j=1, 2, . . . , N) is expressed as follow, $$U_{PCj}=U_j+Z_{sj}\times I_j,$$

where, j denotes a number of a measurement instrument, $U_j$ denotes a load voltage measurement value obtained by the measurement instrument j, $I_j$ denotes a current measurement value obtained by the measurement instrument j, $Z_{sj}$ denotes an impedance value from a measurement point of the measurement instrument j to the coupling node PCj, and N is a positive integer greater than or equal to 2;

in the entire time series, the voltage sample space of the coupling nodes to which all loads belong in the distribution network is as follow, $$\begin{bmatrix} U_{PC1,t_1} & U_{PC2,t_1} & \cdots & U_{PCN,t_1} \\ U_{PC1,t_2} & U_{PC2,t_2} & \cdots & U_{PCN,t_2} \\ \vdots & \vdots & \vdots & \vdots \\ U_{PC1,t_T} & U_{PC2,t_T} & \cdots & U_{PCN,t_T} \end{bmatrix},$$

where, for a specific moment $t_i$ (i=1,2, ..., T), T is a positive integer greater than or equal to 2, and the voltage sample space at the coupling node PCj (j=1, 2, ..., N) corresponding to all loads in the distribution network is expressed as follow, $$U_{t_i}=[U_{PC1,t_i}\ U_{PC2,t_i}\ \cdots\ U_{PCN,t_i}]^T (i=1,2,\ldots,T);\text{ and}$$

in the entire time series, a voltage sample space at the coupling node PCj (j=1, 2, ..., N) to which a load $M_j$ belongs is expressed as follow, $$U_{PCj}=[U_{PCj,t_1}\ U_{PCj,t_2}\ \cdots\ U_{PCj,t_T}]^T (j=1,2,\ldots,N).$$

In an embodiment, the method further includes:

when the measurement instrument j does not detect a current measurement value $I_j$, obtaining the current measurement value $I_j$ according to the measurement information of an active power, reactive power and coupling node voltage amplitude of the load $M_j$ collected by the AMI by using a formula shown below, $$I_j = \frac{\sqrt{P_j^2 + Q_j^2}}{U_j},$$

where $P_j$ denotes an active power measurement value of the load $M_j$ and $Q_j$ denotes a reactive power measurement value of the load $M_j$.

In an embodiment, the calculating a current $I_L$ of a branch to which each load belongs in the distribution network topology and obtaining a current sample space of branches to which all loads belong in the distribution network includes:

calculating the branch current $I_L$ of the branch to which each load belongs according to measurement information of the active power, reactive power and coupling node voltage amplitude of the each load collected by the AMI in the entire time series to obtain the current sample space of the branches to which all loads belong in the distribution network.

In an embodiment, the calculating the branch current $I_L$ of the branch to which each load belongs according to measurement information of active power to obtain the current sample space of the branches to which all loads belong in the distribution network includes:

according to Ohm's law, an amplitude of the current $I_{Lj}$ (j=1, 2, ..., N) of the branch to which each load belongs is expressed as follow, $$I_{Lj} = \frac{\sqrt{P_j^2 + Q_j^2}}{U_j},$$

where $P_j$ denotes the active power measurement value of the load $M_j$, $Q_j$ denotes the reactive power measurement value of the load $M_j$, $U_j$ denotes a voltage amplitude measurement value of the load $M_j$, and N is a positive integer greater than or equal to 2; and in the entire time series, the current sample space of the branches to which all loads belong in the distribution network is as follow.

$$\begin{bmatrix} 1_{L1,t_1} & 1_{L2,t_1} & \cdots & 1_{LN,t_1} \\ 1_{L1,t_2} & 1_{L2,t_2} & \cdots & 1_{LN,t_2} \\ \vdots & \vdots & \vdots & \vdots \\ 1_{L1,t_T} & 1_{L2,t_T} & \cdots & 1_{LN,t_T} \end{bmatrix}$$

In an embodiment, the completing verification and correction of the distribution network topology according to the voltage correlation coefficient and the current correlation coefficient includes:

determining a feeder to which each load belongs based on the voltage correlation coefficient and the current correlation coefficient and according to a determining condition of a selected correlation analysis method; determining whether an upstream and downstream relationship of the each load in the feeder satisfies a condition that voltage amplitudes of coupling nodes in the same feeder decreases from upstream to downstream based on the voltage amplitude of the coupling node to which each load belongs, where a load which does not satisfy the condition is a load with an incorrect topology connection; in responding to the load with the incorrect topology connection being identified, calculating voltage correlation coefficients and current correlation coefficients between the load with the incorrect topology connection and other coupling nodes in the distribution network; and determining a feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

The present application provides a device for identifying a distribution network topology error, including: a memory and a processor. The memory stores executable programs, and the processor, when executing the programs, executes following steps:

calculating a voltage $U_{pc}$ of a coupling node to which each load belongs in the distribution network topology and obtaining a voltage sample space of coupling nodes to which all loads belong in the distribution network;

calculating a current $I_L$ of a branch to which each load belongs in the distribution network topology and obtaining a current sample space of branches to which all loads belong in the distribution network;

calculating a voltage correlation coefficient and a current correlation coefficient respectively between different loads according to the obtained voltage sample space and the current sample space; and completing verification and correction of the distribution network topology according to the voltage correlation coefficient and the current correlation coefficient.

In an embodiment, the calculating a voltage $U_{pc}$ of a coupling node to which each load belongs in the distribution network topology and obtaining a voltage sample space of coupling nodes to which all loads belong in the distribution network includes:

calculating a voltage $U_{pc}$ of a coupling node of a feeder to which each load belongs according to measurement information of a coupling node voltage amplitude of each load collected by an advanced meter infrastructure (AMI) in an entire time series of collecting data based on the AMI to obtain the voltage sample space of the coupling nodes to which all loads belong in the distribution network.

In an embodiment, the calculating a voltage $U_{pc}$ of a coupling node of a feeder to which each load belongs to obtain the voltage sample space of the coupling node to which all loads belong in the distribution network includes:

according to Ohm's law, the voltage amplitude at the coupling node PCj (j=1, 2, ..., N) is expressed as follow, $$U_{PCj} = U_j + Z_{sj} \times I_j$$

where, j denotes a number of a measurement instrument, $U_j$ denotes a load voltage measurement value obtained by the measurement instrument j, $I_j$ denotes a current measurement value obtained by the measurement instrument j, $Z_{sj}$ denotes an impedance value from a measurement point of the measurement instrument j to the coupling node PCj, and N is a positive integer greater than or equal to 2;

in the entire time series, the voltage sample space of the coupling nodes to which all loads belong in the distribution network is as follow, $$\begin{bmatrix} U_{PC1,t_1} & U_{PC2,t_1} & \cdots & U_{PCN,t_1} \\ U_{PC1,t_2} & U_{PC2,t_2} & \cdots & U_{PCN,t_2} \\ \vdots & \vdots & \vdots & \vdots \\ U_{PC1,t_T} & U_{PC2,t_T} & \cdots & U_{PCN,t_T} \end{bmatrix},$$

where, for a specific moment $t_i$ (i=1, 2, ..., T), T is a positive integer greater than or equal to 2, and the voltage sample space at the coupling node PCj (j=1, 2, ..., N) corresponding to all loads in the distribution network is expressed as follow, $$U_{t_i} = [U_{PC1,t_i} \ U_{PC2,t_i} \cdots U_{PCN,t_i}]^T (i=1,2,\ldots,T); \text{ and}$$

in the entire time series, a voltage sample space at the coupling node PCj (j=1, 2, ..., N) to which a load $M_j$ belongs is expressed as follow, $$U_{PCj} = [U_{PCj,t_1} \ U_{PCj,t_2} \cdots U_{PCj,t_T}]^T (j=1,2,\ldots,N).$$

In an embodiment, the processor, when executing the programs, further executes a step below:

when the measurement instrument j does not detect a current measurement value $I_j$, obtaining the current measurement value $I_j$ according to the measurement information of an active power, reactive power and coupling node voltage amplitude of the load $M_j$ collected by the AMI by using a formula shown below, $$I_j = \frac{\sqrt{P_j^2 + Q_j^2}}{U_j},$$

wherein $P_j$ denotes an active power measurement value of the load $M_j$ and $Q_j$ denotes a reactive power measurement value of the load $M_j$.

In an embodiment, the calculating a current $I_L$ of a branch to which each load belongs in the distribution network topology and obtaining a current sample space of branches to which all loads belong in the distribution network includes:

calculating the branch current $I_L$ of the branch to which each load belongs according to measurement information of the active power, reactive power and coupling node voltage amplitude of the each load collected by the AMI in the entire time series to obtain the current sample space of the branches to which all loads belong in the distribution networks.

In an embodiment, the calculating the branch current $I_L$ of the branch to which each load belongs according to measurement information of active power to obtain the current sample space of the branch to which all loads in the distribution network belong includes:

according to Ohm's law, an amplitude of the current $I_{Lj}$ (j=1, 2, ..., N) of the branch to which each load belongs is expressed as follow, $$I_{Lj} = \frac{\sqrt{P_j^2 + Q_j^2}}{U_j},$$

where $P_j$ denotes the active power measurement value of the load $M_j$, $Q_j$ denotes the reactive power measurement value of the load $M_j$, $U_j$ denotes a voltage amplitude measurement value of the load $M_j$, and N is a positive integer greater than or equal to 2; and in the entire time series, the sample space of the branches to which all loads belong in the distribution network is as follow.

$$\begin{bmatrix} 1_{L1,t_1} & 1_{L2,t_1} & \cdots & 1_{LN,t_1} \\ 1_{L1,t_2} & 1_{L2,t_2} & \cdots & 1_{LN,t_2} \\ \vdots & \vdots & \vdots & \vdots \\ 1_{L1,t_T} & 1_{L2,t_T} & \cdots & 1_{LN,t_T} \end{bmatrix}.$$

In an embodiment, the completing verification and correction of the distribution network topology according to the voltage correlation coefficient and the current correlation coefficient includes:

determining a feeder to which each load belongs based on the voltage correlation coefficient and the current correlation coefficient and according to a determining condition of a selected correlation analysis method; determining whether an upstream and downstream relationship of the each load in the feeder satisfies a condition that voltage amplitudes of the coupling nodes in the same feeder decreases from upstream to downstream based on the voltage amplitude of the coupling node to which each load belongs, where a load which does not satisfy the condition is a load with an incorrect topology connection; in responding to the load with the incorrect topology connection being identified, calculating voltage correlation coefficients and current correlation coefficients between the load with the incorrect topology connection and other coupling nodes in the distribution network; and determining the feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

The present application further provides a computer-readable storage medium configured to store computer-executable instructions for executing any method described above.

The present application further provides a computer program product including a computer program stored on a non-transient computer-readable storage medium, where the computer program includes program instructions that, when executed by a computer, enable the computer to execute any method described above.

The present application first establishes a topology error identification principle based on distribution network voltage distribution characteristics and load current distribution characteristics, then obtains the coupling voltage and branch current of the load via measurement information provided by the advanced meter infrastructure (AMI) as well as network data, analyses the correlation of the coupling voltage and branch current, verifies the correctness of the topology, and amends the verified topology error, thereby completing the identification and amendment of the topology error. The validity of the topology error identification algorithm proposed by the present application is verified. The results show that the algorithm is capable of identifying and amending multiple topology errors simultaneously existing and the examples prove the feasibility and validity of the algorithm.

The present application effectively reduces the running time required for identification and ensures the quickness of the topology identification by merely calculating the voltage of the coupling node to which the load belongs and current of the branch to which the load belongs.

The present application avoids the shortcoming of considering merely a single identification factor by taking voltage and current distribution characteristics of the distribution network into account, thereby ensuring the reliability of the topology identification and improving the effectiveness of the topology identification.

DETAILED DESCRIPTION

Figure 1:
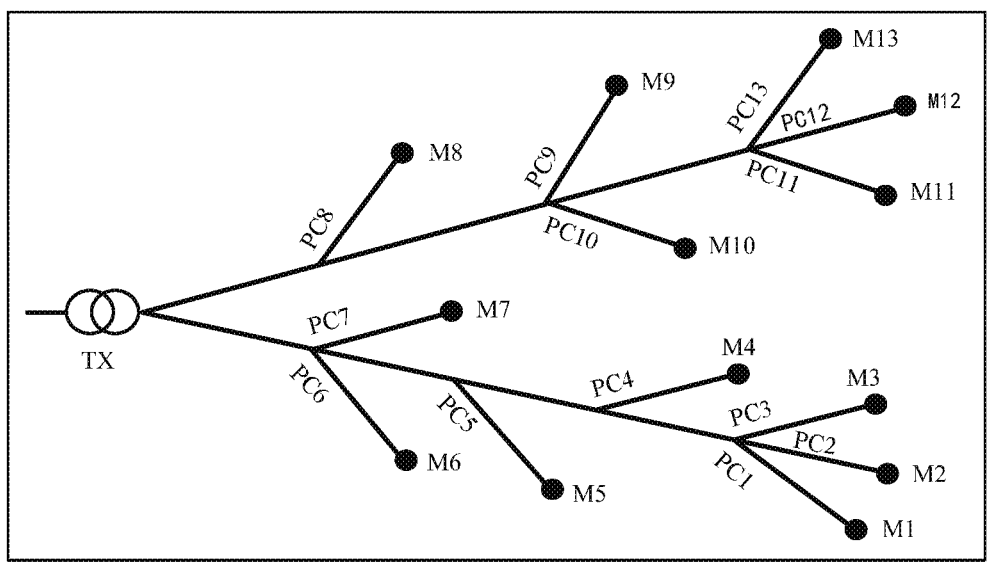
FIG. 1 is a structural diagram of a distribution network according to an embodiment of the present application.

Embodiments of the present application will be described below in detail with reference to the drawings.

In the present application, a method for identifying a distribution network topology error based on measurement information provided by an advanced meter infrastructure (AMI) includes: based on voltage distribution and current distribution characteristics of the distribution network, in an entire time series of collecting data based on the AMI, respectively calculating a voltage of a coupling node to which each load belongs and a current of a branch to which each load belongs to obtain a voltage sample space of the coupling node to which each load belongs and a current sample space of the branch to which each load belongs; respectively analyzing the correlation between the obtained voltage sample space of the coupling node and the current sample space of the branch; and verifying the correctness of the distribution network topology and correcting distribution network topology errors based on analyzed results.

The present application provides a method for identifying a distribution network topology error based on measurement information provided by the AMI. The method includes steps 110, 120, 130 and 140.

In step 110, a voltage $U_{pc}$ of a coupling node to which each load belongs in the distribution network topology is calculated and a voltage sample space of coupling nodes to which all loads belong in the distribution network is obtained.

In an embodiment, step 110 includes: in the entire time series of collecting data based on the AMI, calculating a voltage of a node of a feeder to which each load belongs, that is the voltage $U_{pc}$ of the coupling node to which each load belongs, according to measurement information of an active power, reactive power and coupling node voltage amplitude of each load collected by the AMI to obtain the voltage sample space of the coupling nodes to which all loads belong in the distribution network.

In step 120, a current $I_L$ of a branch to which each load belongs in the distribution network topology is calculated and a current sample space of branches to which all loads belong in the distribution network is obtained.

In an embodiment, the step 120 includes: in the entire time series of collecting data based on the AMI, calculating a current of the branch to which each load belongs, that is the current $I_L$ of the branch to which each load belongs, according to measurement information of the active power, reactive power and coupling node voltage amplitude of each load collected by the AMI to obtain the current sample space of the branches to which all loads belong in the distribution network.

In step 130, a voltage correlation coefficient and a current correlation coefficient between different loads are respectively calculated according to the obtained voltage sample space and the current sample space in steps 110 and 120.

In step 140, the verification and correction of the distribution network topology are completed according to the voltage correlation coefficient and the current correlation coefficient.

In an embodiment, the step 140 includes: based on the voltage correlation coefficient and the current correlation coefficient calculated in step 130, determining a feeder to which each load belongs according to a determining condition of a selected correlation analysis method, and then determining an upstream and downstream relationship of the feeder to which the each load belongs based on the voltage amplitude of the coupling node to which each load belongs in step 110 so as to complete the verification and correction of the distribution network topology.

This embodiment effectively reduces the running time required for identification and ensures the quickness of the topology identification by merely calculating the voltage of the coupling node to which the load belongs and the current of the branch to which the load belongs. This embodiment avoids the shortcoming of considering merely a single identification factor by taking voltage and current distribution characteristics of the distribution network into account, thereby ensuring the reliability of the topology identification and improving the effectiveness of the topology identification.

A radial distribution network model is taken as an example in this embodiment to describe the distribution network topology error identification method based on measurement information provided by the AMI.

FIG. 1 illustrates the structure of the distribution network. The distribution network includes a distribution transformer TX and two feeders connected to the distribution transformer TX, where PCj (j=1, 2, ..., N) is a node where the branch to which the load belongs is connected to the feeders, which is referred as the coupling node.

Each feeder is connected with different loads $M_j$ (j=1, 2, ..., N) and each $M_j$ is provided with an intelligent meter for providing the measurement data required by the topology identification, where N is a positive integer greater than or equal to 2.

FIG. 1 shows a load topology connection relationship under the same distribution transformer. TX is the distribution network, $M_j$ (j=1, 2, ..., N) is the load provided with the intelligent meter, and PCj (j=1, 2, ..., N) is the coupling node to which each load belongs in the feeder.

In step 210, the voltage of the coupling node to which each load belongs is calculated. According to Ohm's law, the voltage amplitude at the coupling node PCj (j=1, 2, ..., N) is expressed as follow, $$U_{PCj} = U_j + Z_{sj} \times I_j \qquad (1)$$

where, j denotes a number of a measurement instrument, $U_j$ and $I_j$ respectively denote a load voltage measurement value and a current measurement value obtained by the measurement instrument j, and $Z_{sj}$ denotes an impedance value from a measurement point of the measurement instrument j to the coupling node PCj.

If the current measurement value $I_j$ is not provided, the current measurement value may be obtained via the power measurement value and the voltage measurement value as shown in formula (2), $$I_j = \frac{\sqrt{P_j^2 + Q_j^2}}{U_j}, \qquad (2)$$

where $P_j$ and $Q_j$ respectively denote the active power measurement value and the reactive power measurement value of the load $M_j$.

The voltage at the coupling node corresponding to each load may be calculated by formulas (1) and (2). FIG. 1 may be simplified as FIG. 2 according to the voltage distribution of the coupling node. That is, each load and branch to which each load belongs are removed from FIG. 1.

Figure 2:
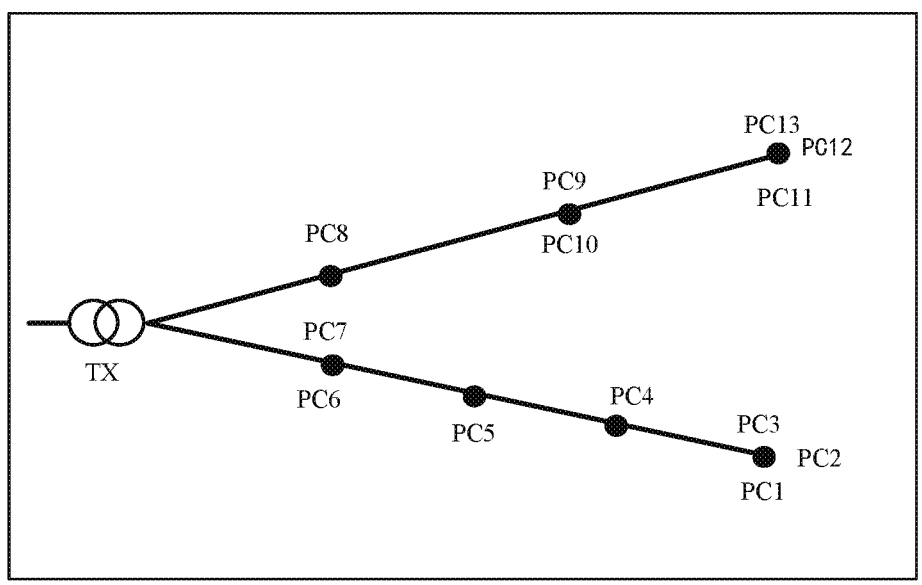
FIG. 2 is a schematic diagram illustrating a voltage distribution of a simplified distribution network according to an embodiment of the present application.

FIG. 2 is a diagram of the simplified power distribution system after the voltage of the coupling node to which each load belongs is calculated. The simplification process is to remove each load and the branch to which each load belongs from FIG. 1.

TX is the distribution network, and PCj (j=1, 2, ..., N) is the coupling node to which each load belongs in the feeder. The above analysis and derivation are carried out on the distribution network at a certain time, that is, the time t is a specific moment.

Since the advanced meter infrastructure provides enough long time series measurement data for calculation and analysis, the voltage sample space of the coupling nodes to which all loads belong in the distribution network may be obtained in the entire time series, that is, $$\begin{bmatrix} U_{PC1,t_1} & U_{PC2,t_1} & \cdots & U_{PCN,t_1} \\ U_{PC1,t_2} & U_{PC2,t_2} & \cdots & U_{PCN,t_2} \\ \vdots & \vdots & \vdots & \vdots \\ U_{PC1,t_T} & U_{PC2,t_T} & \cdots & U_{PCN,t_T} \end{bmatrix} \qquad (3)$$

where, for the specific moment $t_j$ (i=1,2, ..., T), the voltage sample space at the coupling node PCj (j=1, 2, ..., N) corresponding to all loads in the distribution network is expressed as follow, $$U_{t_i} = [U_{PC1,t_i}\ U_{PC2,t_i} \cdots U_{PCN,t_i}]^T (i=1,2,\ldots,T);\ \text{and}$$

in the entire time series, the voltage sample space at the coupling node PCj (j=1, 2, ..., N) to which the load PCj (j=1, 2, ..., N) belongs is expressed as:

$$U_{PCj} = [U_{PCj,t_1}\ U_{PCj,t_2} \cdots U_{PCj,t_T}]^T (j=1,2,\ldots,N).$$

In step 220, the current of the branch to which each load belongs is calculated.

According to Ohm's law, an amplitude of the current $I_{Lj}$ (j=1, 2, ..., N) of the branch to which each load belongs is expressed as follow, $$I_{Lj} = \frac{\sqrt{P_j^2 + Q_j^2}}{U_j} \qquad (4)$$

where $P_j$ and $Q_j$ respectively denote the active power measurement value and the reactive power measurement value of the load $M_j$, and $U_j$ denotes the current measurement value of the load $M_j$.

Figure 3:
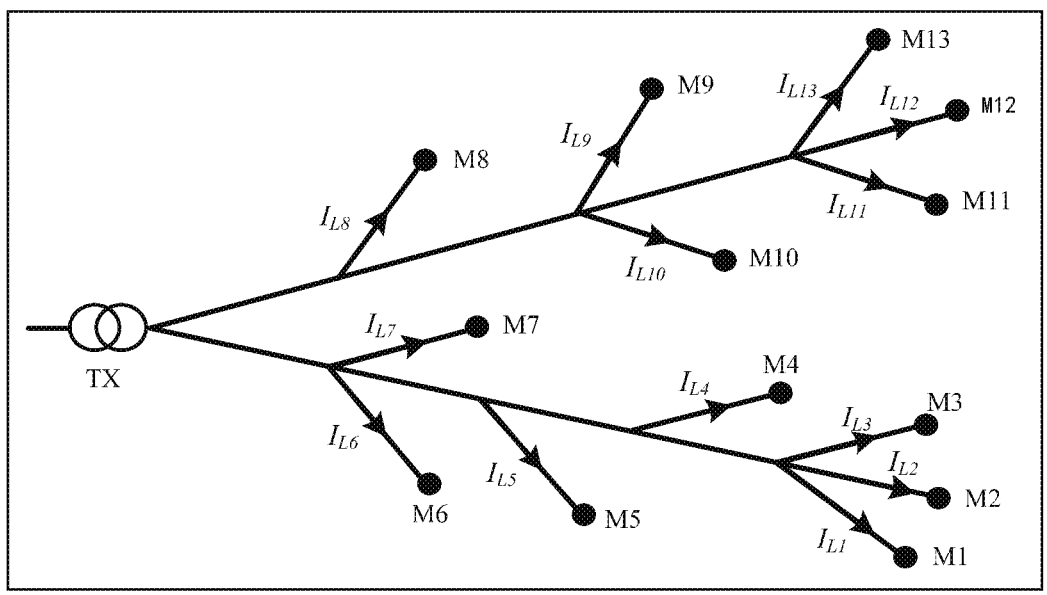
FIG. 3 is a schematic diagram illustrating a branch current distribution of a distribution network according to an embodiment of the present application.

Based on the current distribution of the branch to which each load belongs, FIG. 1 may be converted into FIG. 3, that is, the current of the branch to which each load belongs is clearly marked in the branch.

FIG. 3 is a diagram of the current distribution of the branch to which each load belongs after the current of the branch to which each load belongs is calculated. That is, the current of the branch to which each load belongs is marked in the branch. TX is the distribution network, $M_j$ (j=1, 2, ..., N) is the load provided with the intelligent meter, and PCj (j=1, 2, ..., N) is the coupling node to which each load belongs in the feeder. $I_{Lj}$ (j=1, 2, ..., N) is the current of the branch to which each load belongs.

The above analysis and derivation are carried out on the distribution network at a certain time, that is, the time t is a specific moment. Since the advanced meter infrastructure provides enough long time series measurement data for calculation and analysis, the current sample space of the branch to which all loads in the distribution network belong may be obtained in the entire time series T. The current sample space is shown below.

$$\begin{bmatrix} I_{L1,t_1} & I_{L2,t_1} & \cdots & I_{LN,t_1} \\ I_{L1,t_2} & I_{L2,t_2} & \cdots & I_{LN,t_2} \\ \vdots & \vdots & \vdots & \vdots \\ I_{L1,t_T} & I_{L2,t_T} & \cdots & I_{LN,t_T} \end{bmatrix} \qquad (5)$$

In step 230, the voltage correlation coefficient and the current correlation coefficient between different loads are calculated.

A common correlation analysis method is selected to perform the calculation.

In step 240, the distribution network topology is verified and corrected.

Based on the voltage correlation coefficient and the current correlation coefficient calculated in step 230, a feeder to which each load belongs is determined according to a determining condition of a selected correlation analysis method, and based on the voltage amplitude of the coupling node to which each load belongs in step 210, an upstream and downstream relationship of the feeder to which each load belong is determined, that is the voltage amplitude of the coupling node in the same feeder decreases from upstream to downstream, so as to complete the verification of the topology. In responding to the load with the incorrect topology connection being identified, the incorrect topology connection is corrected. That is, a load with the incorrect topology connection is determined, and voltage correlation coefficients and current correlation coefficients between the load with the incorrect topology connection and other coupling nodes in the distribution network are calculated. If a correlation criterion is satisfied, the feeder to which the load with the incorrect topology connection belongs and a coupling connection point of the load with the incorrect topology connection in the feeder are determined so as to complete the verification of correctness of the distribution network and the correction of the incorrect topology connection.

The present application first establishes a topology error identification principle based on distribution network voltage distribution characteristics and load current distribution characteristics, then obtains the coupling voltage and branch current of the load via measurement information provided by the advanced meter infrastructure (AMI), analyses the correlation of the coupling voltage and branch current, verifies the correctness of the topology, and amends the verified topology error, thereby completing the identification and correction of the topology error. The validity of the topology error identification algorithm proposed by the present application is verified. The results show that the algorithm is capable of identifying and amending multiple topology errors simultaneously existing and the examples prove the feasibility and validity of the algorithm.

An embodiment provides a device for identifying a distribution network topology error, including a memory and a processor.

The memory stores executable programs, and the processor, when executing the programs, executes following steps:

calculating a voltage $U_{pc}$ of a coupling node to which each load belongs in the distribution network topology and obtaining a voltage sample space of coupling nodes to which all loads belong in the distribution network;

calculating a current $I_L$ of a branch to which each load belongs in the distribution network topology and obtaining a current sample space of branches to which all loads belong in the distribution network;

calculating a voltage correlation coefficient and a current correlation coefficient respectively between different loads according to the obtained voltage sample space and the current sample space; and completing verification and correction of the distribution network topology according to the voltage correlation coefficient and the current correlation coefficient.

In an embodiment, the calculating a voltage $U_{pc}$ of a coupling node to which each load belongs in the distribution network topology and obtaining a voltage sample space of a coupling node to which all loads in the distribution network belong includes:

calculating a voltage $U_{pc}$ of a coupling node of a feeder to which the each load belongs according to measurement information of a coupling node voltage amplitude of the each load collected by an advanced meter infrastructure (AMI) in an entire time series of collecting data based on the AMI to obtain the voltage sample space of the coupling node to which all loads in the distribution network belong.

In an embodiment, the calculating a voltage $U_{pc}$ of a coupling node of a feeder to which each load belongs to obtain the voltage sample space of the coupling node to which all loads in the distribution network belong includes: according to Ohm's law, the voltage amplitude at a coupling node PCj (j=1, 2, ..., N) is expressed as follow, $$U_{PCj}=U_j+Z_{sj}\times I_j$$

where, j denotes a number of a measurement instrument, $U_j$ denotes a load voltage measurement value obtained by the measurement instrument j, $I_j$ denotes a current measurement value obtained by the measurement instrument j, $Z_{sj}$ denotes an impedance value from a measurement point of the measurement instrument j to the coupling node PCj, and N is a positive integer greater than or equal to 2;

in the entire time series, the voltage sample space of the coupling nodes to which all loads belong in the distribution network is as follow, $$\begin{bmatrix} U_{PC1,t_1} & U_{PC2,t_1} & \cdots & U_{PCN,t_1} \\ U_{PC1,t_2} & U_{PC2,t_2} & \cdots & U_{PCN,t_2} \\ \vdots & \vdots & \vdots & \vdots \\ U_{PC1,t_T} & U_{PC2,t_T} & \cdots & U_{PCN,t_T} \end{bmatrix}$$

where, for a specific moment $t_i$ (i=1,2, ..., T), T is a positive integer greater than or equal to 2, and the voltage sample space at the coupling node PCj (j=1, 2, ..., N) corresponding to all loads in the distribution network is expressed as follow, $$U_{t_i}=[U_{PC1,t_i} U_{PC2,t_i} \cdots U_{PCN,t_i}]^T (i=1,2,\ldots,T); \text{ and}$$

in the entire time series, a voltage sample space at the coupling node PCj (j=1, 2, ..., N) to which a load $M_j$ belongs is expressed as follow, $$U_{PCj}=[U_{PCj,t_1} U_{PCj,t_2} \cdots U_{PCj,t_T}]^T (j=1,2,\ldots,N).$$

In an embodiment, the processor, when executing the programs, further executes a step below: when the measurement instrument j does not detect a current measurement value $I_j$, obtaining the current measurement value $I_j$ according to the measurement information of an active power, reactive power and coupling node voltage amplitude of the load $M_j$ collected by the AMI by using a formula shown below, $$I_j = \frac{\sqrt{P_j^2+Q_j^2}}{U_j},$$

where $P_j$ denotes an active power measurement value of the load $M_j$ and $Q_j$ denotes a reactive power measurement value of the load $M_j$.

In an embodiment, the calculating a current $I_L$ of a branch to which each load belongs in the distribution network topology and obtaining a current sample space of branches to which all loads belong in the distribution network includes:

calculating the branch current $I_L$ of the branch to which each load belongs according to measurement information of the active power, reactive power and coupling node voltage amplitude of the each load collected by the AMI in the entire time series to obtain the current sample space of the branches to which all loads belong in the distribution network.

In an embodiment, the calculating the branch current $I_L$ of the branch to which each load belongs to obtain the current sample space of the branches to which all loads belong in the distribution network includes:

according to Ohm's law, an amplitude of the current $I_{Lj}$ (j=1, 2, ..., N) of the branch to which each load belongs is expressed as follow, $$I_{Lj} = \frac{\sqrt{P_j^2 + Q_j^2}}{U_j},$$

where $P_j$ denotes the active power measurement value of the load $M_j$, $Q_j$ denotes the reactive power measurement value of the load $M_j$, $U_j$ denotes a voltage amplitude measurement value of the load $M_j$; and in the entire time series, the current sample space of the branches to which all loads belong in the distribution networks is as follow.

$$\begin{bmatrix} I_{L1,t_1} & I_{L2,t_1} & \cdots & I_{LN,t_1} \\ I_{L1,t_2} & I_{L2,t_2} & \cdots & I_{LN,t_2} \\ \vdots & \vdots & \vdots & \vdots \\ I_{L1,t_T} & I_{L2,t_T} & \cdots & I_{LN,t_T} \end{bmatrix}$$

In an embodiment, the completing verification and amendment of the distribution network topology according to the voltage correlation coefficient and the current correlation coefficient includes:

determining a feeder to which each load belongs based on the voltage correlation coefficient and the current correlation coefficient and according to a determining condition of a selected correlation analysis method; determining whether an upstream and downstream relationship of the each load in the feeder satisfies a condition that voltage amplitudes of coupling nodes in the same feeder decreases from upstream to downstream based on the voltage amplitude of the coupling node to which each load belongs, where a load which does not satisfy the condition is a load with an incorrect topology connection; in responding to the load with the incorrect topology connection being identified, calculating voltage correlation coefficients and current correlation coefficients between the load with the incorrect topology connection and other coupling nodes in the distribution network; and determining a feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

An Embodiment of the present application further provide a computer-readable storage medium configured to store computer-executable instructions for executing any distribution network topology error identification method described above.

Figure 4:
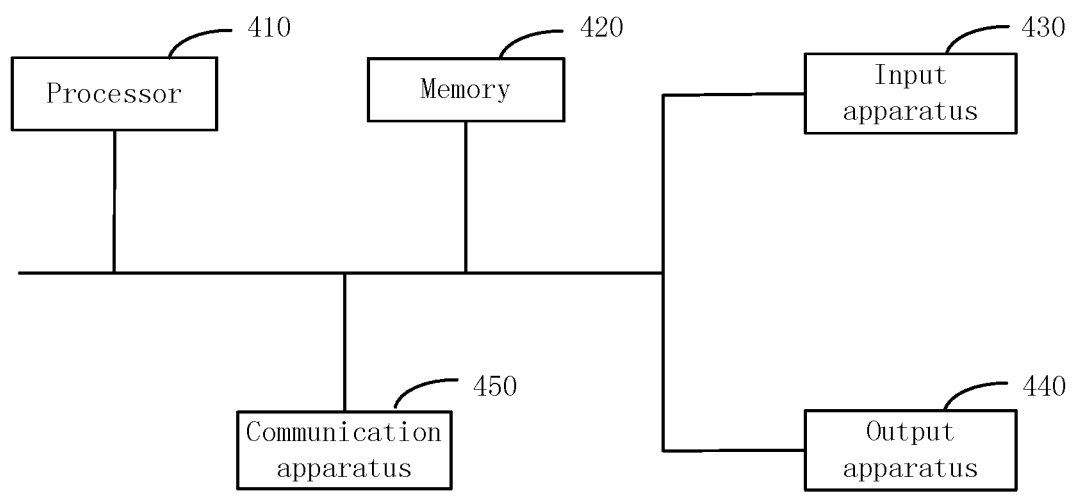
FIG. 4 is a schematic diagram illustrating a hardware structure of a distribution network topology error identification apparatus according to an embodiment of the present application.

FIG. 4 is a schematic diagram illustrating a hardware structure of a distribution network topology error identification apparatus according to an embodiment of the present application.

As shown in FIG. 4, the identification apparatus includes: one or more processors 410 and a memory 420. One processor 410 is taken as an example in FIG. 4.

The identification apparatus may further include: an input apparatus 430 and an output apparatus 440.

The processor 410, the memory 420, the input apparatus 430 and the output apparatus 440 in the identification apparatus may be connected via a bus or other means, FIG. 4 uses connection by a bus as an example.

The input apparatus 430 may receive inputted digital or character information and the output apparatus 440 may include a display screen and other display devices.

As a computer-readable storage medium, the memory 420 is used for storing software programs and computer-executable programs and modules. The processor 410 runs the software programs, instructions and modules stored in the memory 420 to perform function applications and data processing, that is, to implement the distribution network topology error identification method in the above embodiments.

The memory 420 may include a program storage area and a data storage area. The program storage area may store an operating system and an application program required by at least one function while the data storage area may store data created depending on use of the identification apparatus. In addition, the memory may include a volatile memory, such as a random access memory (RAM), and may also include a nonvolatile memory, such as at least one click memory, a flash memory or other nonvolatile solid-state memories.

The memory 420 may be a non-transient computer storage medium or a transient computer storage medium. The non-transient computer storage medium includes, for example, at least one disk memory, a flash memory or another nonvolatile solid-state memory. In some embodiments, the memory 420 may include memories which are remotely disposed relative to the processor 410 and these remote memories may be connected to the identification apparatus via a network. Examples of such a network may include the Internet, intranets, local area networks, mobile communication networks, and combinations thereof.

The input apparatus 430 may be configured to receive inputted digital or character information and generate key signal input related to user settings and function control of the identification apparatus. The output apparatus 440 may include a display screen and other display devices.

The identification apparatus in this embodiment may include a communication apparatus 450 for transmitting and/or receiving information via a communication network.

It will be understood by those of ordinary skill in the art that all or part of the procedure steps in the methods of the above embodiments may be implemented by related hardware executed by one or more computer programs, these programs may be stored in a non-transient computer-readable storage medium, and during the execution of these programs, the procedure steps in the above embodiments may be implemented. The non-transient computer-readable storage medium may be a magnetic disk, an optical disk, a read-only memory (ROM) or a random access memory (RAM).

What is claimed is:

1. A method for identifying a distribution network topology error, comprising:

calculating a voltage $U_{pc}$ of a coupling node to which each load belongs in the distribution network topology, and obtaining a voltage sample space of coupling nodes to which all loads belong in the distribution network;

calculating a current $I_L$ of a branch to which each load belongs in the distribution network topology, and obtaining a current sample space of branches to which all loads belong in the distribution network;

calculating a voltage correlation coefficient and a current correlation coefficient respectively between different loads according to the obtained voltage sample space and the current sample space; and completing verification and correction of the distribution network topology according to the voltage correlation coefficient and the current correlation coefficient;

wherein the calculating a current $I_L$ of a branch to which each load belongs in the distribution network topology and obtaining a current sample space of branches to which all loads belong in the distribution network comprises:

calculating the branch current $I_L$ of the branch to which the each load belongs according to measurement information of an active power, reactive power and coupling node voltage amplitude of the each load collected by an advanced meter infrastructure (AMI) in an entire time series of collecting data to obtain the current sample space of the branches to which all loads belong in the distribution network.

2. The method of claim 1, wherein the calculating a voltage $U_{pc}$ of a coupling node to which each load belongs in the distribution network topology, and obtaining a voltage sample space of coupling nodes to which all loads belong in the distribution network comprises:

calculating a voltage $U_{pc}$ of a coupling node of a feeder to which the each load belongs according to measurement information of a coupling node voltage amplitude of the each load collected by the AMI in the entire time series of collecting data based on the AMI to obtain the voltage sample space of the coupling nodes to which all loads belong in the distribution network.

3. The method of claim 2, wherein the calculating a current $I_L$ of a branch to which each load belongs in the distribution network topology, and obtaining a current sample space of branches to which all loads belong in the distribution network comprises:

according to Ohm's law, a voltage amplitude at a coupling node PCj (j=1, 2, ..., N) is expressed as follow, $$U_{PCj} = U_j + Z_{sj} \times I_j,$$

wherein j denotes a number of a measurement instrument, $U_j$ denotes a load voltage measurement value obtained by the measurement instrument j, $I_j$ denotes a current measurement value obtained by the measurement instrument j, $Z_{sj}$ denotes an impedance value from a measurement point of the measurement instrument j to the coupling node PCj, and N is a positive integer greater than or equal to 2;

in the entire time series, the voltage sample space of the coupling nodes to which all loads belong in the distribution network is as follow, $$\begin{bmatrix} U_{PC1,t_1} & U_{PC2,t_1} & \cdots & U_{PCN,t_1} \\ U_{PC1,t_2} & U_{PC2,t_2} & \cdots & U_{PCN,t_2} \\ \vdots & \vdots & \vdots & \vdots \\ U_{PC1,t_T} & U_{PC2,t_T} & \cdots & U_{PCN,t_T} \end{bmatrix},$$

wherein, for a specific moment $t_i$ (i=1, 2, ..., T), T is a positive integer greater than or equal to 2, and the voltage sample space at the coupling node PCj (j=1, 2, ..., N) corresponding to all loads in the distribution network is expressed as follow, $$U_{t_i} = [U_{PC1,t_i} U_{PC2,t_i} \cdots U_{PCN,t_i}]^T (i=1,2,\ldots,T); \text{ and}$$

in the entire time series, a voltage sample space at the coupling node PCj (j=1, 2, ..., N) to which a load $M_j$ belongs is expressed as follow, $$U_{PCj} = [U_{PCj,t_1} U_{PCj,t_2} \cdots U_{PCj,t_T}]^T (j=1,2,\ldots,N).$$

4. The method of claim 3, further comprising:

when the measurement instrument j does not detect a current measurement value $I_j$, obtaining the current measurement value $I_j$ according to the measurement information of an active power, reactive power and coupling node voltage amplitude of the load $M_j$ collected by the AMI by using a formula shown below, $$I_j = \frac{\sqrt{P_j^2 + Q_j^2}}{U_j},$$

wherein $P_j$ denotes an active power measurement value of the load $M_j$ and $Q_j$ denotes a reactive power measurement value of the load $M_j$.

5. The method of claim 1, wherein the calculating the branch current $I_L$ of the branch to which the each load belongs to obtain the current sample space of the branches to which all loads belong in the distribution network comprises:

according to Ohm's law, an amplitude of the current $I_{Lj}$ (j=1, 2, ..., N) of the branch to which each load belongs is expressed as follow, $$I_{Lj} = \frac{\sqrt{P_j^2 + Q_j^2}}{U_j},$$

wherein $P_j$ denotes the active power measurement value of the load $M_j$, $Q_j$ denotes the reactive power measurement value of the load $M_j$, $U_j$ denotes a voltage amplitude measurement value of the load $M_j$, and N is a positive integer greater than or equal to 2; and in the entire time series, the current sample space of the branches to which all loads belong in the distribution network is as follow, $$\begin{bmatrix} I_{L1,t_1} & I_{L2,t_1} & \cdots & I_{LN,t_1} \\ I_{L1,t_2} & I_{L2,t_2} & \cdots & I_{LN,t_2} \\ \vdots & \vdots & \vdots & \vdots \\ I_{L1,t_T} & I_{L2,t_T} & \cdots & I_{LN,t_T} \end{bmatrix}.$$

6. The method of claim 1, wherein the completing verification and correction of the distribution network topology according to the voltage correlation coefficient and the current correlation coefficient comprises:

determining a feeder to which each load belongs based on the voltage correlation coefficient and the current correlation coefficient and according to a determining condition of a selected correlation analysis method;

determining whether an upstream and downstream relationship of the each load in the feeder satisfies a condition that voltage amplitudes of coupling nodes in a same feeder decreases from upstream to downstream based on the voltage amplitude of the coupling node to which each load belongs, wherein a load which does not satisfy the condition is a load with an incorrect topology connection;

in respond to the load with the incorrect topology connection being identified, calculating voltage correlation coefficients and current correlation coefficients between the load with the incorrect topology connection and other coupling nodes in the distribution network; and determining a feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

7. The method of claim 2, wherein the completing verification and correction of the distribution network topology according to the voltage correlation coefficient and the current correlation coefficient comprises:

determining a feeder to which each load belongs based on the voltage correlation coefficient and the current correlation coefficient and according to a determining condition of a selected correlation analysis method;

determining whether an upstream and downstream relationship of the each load in the feeder satisfies a condition that voltage amplitudes of coupling nodes in a same feeder decreases from upstream to downstream based on the voltage amplitude of the coupling node to which each load belongs, wherein a load which does not satisfy the condition is a load with an incorrect topology connection;

in response to the load with the incorrect topology connection being identified, calculating voltage correlation coefficients and current correlation coefficients between the load with the incorrect topology connection and other coupling nodes in the distribution network; and determining a feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

8. A device for identifying a distribution network topology error, comprising a memory and a processor, wherein the memory stores executable programs, and the processor, when executing the programs, executes following steps:

calculating a voltage $U_{pc}$ of a coupling node to which each load belongs in the distribution network topology, and obtaining a voltage sample space of coupling nodes to which all loads belong in the distribution network;

calculating a current $I_L$ of a branch to which each load belongs in the distribution network topology and obtaining a current sample space of branches to which all loads belong in the distribution network;

calculating a voltage correlation coefficient and a current correlation coefficient respectively between different loads according to the obtained voltage sample space and the current sample space; and completing verification and correction of the distribution network topology according to the voltage correlation coefficient and the current correlation coefficient;

wherein the calculating a current $I_L$ of a branch to which each load belongs in the distribution network topology and obtaining a current sample space of branches to which all loads belong in the distribution network comprises:

calculating the branch current $I_L$ of the branch to which the each load belongs according to measurement information of an active power, reactive power and coupling node voltage amplitude of the each load collected by an advanced meter infrastructure (AMI) in an entire time series of collecting data to obtain the current sample space of the branches to which all loads belong in the distribution network.

9. The device of claim 8, wherein the calculating a voltage $U_{pc}$ of a coupling node to which each load belongs in the distribution network topology and obtaining a voltage sample space of a coupling node to which all loads in the distribution network belong comprises:

calculating a voltage $U_{pc}$ of a coupling node of a feeder to which the each load belongs according to measurement information of a coupling node voltage amplitude of the each load collected by the in the entire time series of collecting data based on the AMI to obtain the voltage sample space of the coupling nodes to which all loads belong in the distribution network.

10. The device of claim 9, wherein the calculating a voltage $U_{pc}$ of a coupling node of a feeder to which each load belongs to obtain the voltage sample space of the coupling node to which all loads in the distribution network belong comprises:

according to Ohm's law, a voltage amplitude at a coupling node PCj (j=1, 2, . . . , N) is expressed as follow, $$U_{PCj}=U_j+Z_{sj} \times I_j,$$

wherein j denotes a number of a measurement instrument, $U_j$ denotes a load voltage measurement value obtained by the measurement instrument j, $I_j$ denotes a current measurement value obtained by the measurement instrument j, $Z_{sj}$ denotes an impedance value from a measurement point of the measurement instrument j to the coupling node PCj, and N is a positive integer greater than or equal to 2;

in the entire time series, the voltage sample space of the coupling nodes to which all loads belong in the distribution network is as follow, $$\begin{bmatrix} U_{PC1,t_1} & U_{PC2,t_1} & \ldots & U_{PCN,t_1} \\ U_{PC1,t_2} & U_{PC2,t_2} & \ldots & U_{PCN,t_2} \\ \vdots & \vdots & \vdots & \vdots \\ U_{PC1,t_T} & U_{PC2,t_T} & \ldots & U_{PCN,t_T} \end{bmatrix},$$

wherein, for a specific moment $t_i$ (i=1, 2, . . . , T), T is a positive integer greater than or equal to 2, and the voltage sample space at the coupling node PCj (j=1, 2, . . . , N) corresponding to all loads in the distribution network is expressed as follow, $$U_{t_i}=[U_{PC1,t_i} U_{PC2,t_i} \ldots U_{PCN,t_i}]^T (i=1,2,\ldots,T); \text{ and}$$

in the entire time series, a voltage sample space at the coupling node PCj (j=1, 2, . . . , N) to which a load $M_j$ belongs is expressed as follow, $$U_{PCj}=[U_{PCj,t_1} U_{PCj,t_2} \ldots U_{PCj,t_T}]^T (j=1,2,\ldots,N).$$

11. The device of claim 10, wherein the processor, when executing the programs, further executes a step below:

when the measurement instrument j does not detect a current measurement value $I_j$, obtaining the current measurement value $I_j$ according to the measurement information of an active power, reactive power and coupling node voltage amplitude of the load $M_j$ collected by the AMI by using a formula shown below, $$I_j = \frac{\sqrt{P_j^2 + Q_j^2}}{U_j},$$

wherein $P_j$ denotes an active power measurement value of the load $M_j$ and $Q_j$ denotes a reactive power measurement value of the load $M_j$.

12. The device of claim 8, wherein the calculating the branch current $I_L$ of the branch to which the each load belongs to obtain the current sample space of the branches to which all loads belong in the distribution network comprises:
according to Ohm's law, an amplitude of the current $I_{Lj}$ (j=1, 2, . . . , N) of the branch to which each load belongs is expressed as follow, $$I_{Lj} = \frac{\sqrt{P_j^2 + Q_j^2}}{U_j},$$

wherein $P_j$ denotes the active power measurement value of the load $M_j$, $Q_j$ denotes the reactive power measurement value of the load $M_j$, $U_j$ denotes a voltage amplitude measurement value of the load $M_j$, and N is a positive integer greater than or equal to 2; and
in the entire time series, the current sample space of the branches to which all loads belong in the distribution network is as follow, $$\begin{bmatrix} I_{L1,t_1} & I_{L2,t_1} & \cdots & I_{LN,t_1} \\ I_{L1,t_2} & I_{L2,t_2} & \cdots & I_{LN,t_2} \\ \vdots & \vdots & \vdots & \vdots \\ I_{L1,t_T} & I_{L2,t_T} & \cdots & I_{LN,t_T} \end{bmatrix}.$$

13. The device of claim 8, wherein the completing verification and correction of the distribution network topology according to the voltage correlation coefficient and the current correlation coefficient comprises:
determining a feeder to which each load belongs based on the voltage correlation coefficient and the current correlation coefficient and according to a determining condition of a selected correlation analysis method;
determining whether an upstream and downstream relationship of the each load in the feeder satisfies a condition that voltage amplitudes of coupling nodes in a same feeder decreases from upstream to downstream based on the voltage amplitude of the coupling node to which each load belongs, wherein a load which does not satisfy the condition is a load with an incorrect topology connection;
in respond to the load with the incorrect topology connection being identified, calculating voltage correlation coefficients and current correlation coefficients between the load with the incorrect topology connection and other coupling nodes in the distribution network; and
determining a feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

14. The device of claim 9, wherein the calculating a current $I_L$ of a branch to which each load belongs in the distribution network topology and obtaining a current sample space of branches to which all loads belong in the distribution network belong comprises:
calculating the branch current $I_L$ of the branch to which the each load belongs according to measurement information of the active power, reactive power and coupling node voltage amplitude of the each load collected by the AMI in the entire time series to obtain the current sample space of the branches to which all loads belong in the distribution network.

15. The device of claim 9, wherein the completing verification and correction of the distribution network topology according to the voltage correlation coefficient and the current correlation coefficient comprises:
determining a feeder to which each load belongs based on the voltage correlation coefficient and the current correlation coefficient and according to a determining condition of a selected correlation analysis method;
determining whether an upstream and downstream relationship of the each load in the feeder satisfies a condition that voltage amplitudes of coupling nodes in a same feeder decreases from upstream to downstream based on the voltage amplitude of the coupling node to which each load belongs, wherein a load which does not satisfy the condition is a load with an incorrect topology connection;
in respond to the load with the incorrect topology connection being identified, calculating voltage correlation coefficients and current correlation coefficients between the load with the incorrect topology connection and other coupling nodes in the distribution network; and
determining a feeder to which the load with the incorrect topology connection belongs and a coupling connection point of the load with the incorrect topology connection in the feeder when the voltage correlation coefficients and the current correlation coefficients satisfy a correlation criterion, so as to complete the verification of correctness of the distribution network and the correction of the incorrect topology connection.

16. A non-transitory computer-readable storage medium, which is configured to store computer-executable instructions for executing the following steps:
calculating a voltage $U_{pc}$ of a coupling node to which each load belongs in the distribution network topology, and obtaining a voltage sample space of coupling nodes to which all loads belong in the distribution network;
calculating a current $I_L$ of a branch to which each load belongs in the distribution network topology, and obtaining a current sample space of branches to which all loads belong in the distribution network;
calculating a voltage correlation coefficient and a current correlation coefficient respectively between different loads according to the obtained voltage sample space and the current sample space; and
completing verification and correction of the distribution network topology according to the voltage correlation coefficient and the current correlation coefficient wherein the calculating a current $I_L$ of a branch to which each load belongs in the distribution network topology and obtaining a current sample space of branches to which all loads belong in the distribution network comprises:

calculating the branch current $I_L$ of the branch to which the each load belongs according to measurement information of an active power, reactive power and coupling node voltage amplitude of the each load collected by an advanced meter infrastructure (AMI) in an entire time series of collecting data to obtain the current sample space of the branches to which all loads belong in the distribution network.

17. The non-transitory computer-readable storage medium of claim 16, wherein the calculating a voltage $U_{pc}$ of a coupling node to which each load belongs in the distribution network topology, and obtaining a voltage sample space of coupling nodes to which all loads belong in the distribution network comprises:

calculating a voltage $U_{pc}$ of a coupling node of a feeder to which the each load belongs according to measurement information of a coupling node voltage amplitude of the each load collected by the AMI in the entire time series of collecting data based on the AMI to obtain the voltage sample space of the coupling nodes to which all loads belong in the distribution network.

18. The non-transitory computer-readable storage medium of claim 17, wherein the calculating a current $I_L$ of a branch to which each load belongs in the distribution network topology, and obtaining a current sample space of branches to which all loads belong in the distribution network comprises:

according to Ohm's law, a voltage amplitude at a coupling node PCj (j=1, 2, . . . , N) is expressed as follow, $U_{PCj} = I_j + Z_{sj} \times I_j$, wherein j denotes a number of a measurement instrument, $U_j$ denotes a load voltage measurement value obtained by the measurement instrument j, $I_j$ denotes a current measurement value obtained by the measurement instrument j, $Z_{sj}$ denotes an impedance value from a measurement point of the measurement instrument j to the coupling node PCj, and N is a positive integer greater than or equal to 2;

in the entire time series, the voltage sample space of the coupling nodes to which all loads belong in the distribution network is as follow, $$\begin{bmatrix} U_{PC1,t_1} & U_{PC2,t_1} & \cdots & U_{PCN,t_1} \\ U_{PC1,t_2} & U_{PC2,t_2} & \cdots & U_{PCN,t_2} \\ \vdots & \vdots & \vdots & \vdots \\ U_{PC1,t_T} & U_{PC2,t_T} & \cdots & U_{PCN,t_T} \end{bmatrix},$$

wherein, for a specific moment $t_j$ (j=1, 2, . . . , T), T is a positive integer greater than or equal to 2, and the voltage sample space at the coupling node PCj (j=1, 2, . . . , N) corresponding to all loads in the distribution network is expressed as follow, $U_{t_i} = [U_{PC1,t_i} \; U_{PC2,t_i} \; \ldots \; U_{PCN,t_i}]^T (i=1,2,\ldots,T)$; and in the entire time series, a voltage sample space at the coupling node PCj (j=1, 2, . . . , N) to which a load $M_j$ belongs is expressed as follow, $U_{PCj} = [U_{PCj,t_1} \; U_{PCj,t_2} \; \ldots \; U_{PCj,t_T}]^T (j=1,2,\ldots,N)$.

19. The non-transitory computer-readable storage medium of claim 18, further comprising:

when the measurement instrument j does not detect a current measurement value $I_j$, obtaining the current measurement value $I_j$ according to the measurement information of an active power, reactive power and coupling node voltage amplitude of the load $M_j$ collected by the AMI by using a formula shown below, $$I_j = \frac{\sqrt{P_j^2 + Q_j^2}}{U_j},$$

wherein $P_j$ denotes an active power measurement value of the load $M_j$ and $Q_j$ denotes a reactive power measurement value of the load $M_j$.

20. The non-transitory computer-readable storage medium of claim 16, wherein the calculating the branch current $I_L$ of the branch to which the each load belongs to obtain the current sample space of the branches to which all loads belong in the distribution network comprises:

according to Ohm's law, an amplitude of the current $I_{Lj}$ (j=1, 2, . . . , N) of the branch to which each load belongs is expressed as follow, $$I_{Lj} = \frac{\sqrt{P_j^2 + Q_j^2}}{U_j},$$

wherein $P_j$ denotes the active power measurement value of the load $M_j$, $Q_j$ denotes the reactive power measurement value of the load $M_j$, $U_j$ denotes a voltage amplitude measurement value of the load $M_j$, and N is a positive integer greater than or equal to 2; and in the entire time series, the current sample space of the branches to which all loads belong in the distribution network is as follow, $$\begin{bmatrix} I_{L1,t_1} & I_{L2,t_1} & \cdots & I_{LN,t_1} \\ I_{L1,t_2} & I_{L2,t_2} & \cdots & I_{LN,t_2} \\ \vdots & \vdots & & \vdots \\ I_{L1,t_T} & I_{L2,t_T} & \cdots & I_{LN,t_T} \end{bmatrix}.$$

\* \* \* \* \*